United States Patent [19]

Ober et al.

[11] Patent Number: 5,318,877
[45] Date of Patent: Jun. 7, 1994

[54] BILAYER RESIST AND PROCESS FOR PREPARING SAME

[75] Inventors: Christopher K. Ober; Allen H. Gabor, both of Ithaca; Eric A. Lehner, Poughkeepsie; Guoping Mao; Lizabeth A. Schneggenburger, both of Ithaca, all of N.Y.

[73] Assignee: Cornell Research Foundation, Inc., Ithaca, N.Y.

[21] Appl. No.: 155,796

[22] Filed: Nov. 22, 1993

Related U.S. Application Data

[62] Division of Ser. No. 934,088, Aug. 21, 1992, Pat. No. 5,290,397.

[51] Int. Cl.$^5$ .................. G03C 1/492; G03C 1/494
[52] U.S. Cl. .................. 430/270; 156/659.1; 156/904; 430/296; 430/313; 430/323
[58] Field of Search .................. 156/643, 657, 659.1, 156/662, 904, 345; 525/193, 284, 288, 478, 479; 430/5, 9, 18, 270, 271, 280, 286, 296, 313, 323, 326

[56] References Cited

U.S. PATENT DOCUMENTS

| | | | |
|---|---|---|---|
| 4,061,799 | 12/1977 | Brewer | 156/643 X |
| 4,481,049 | 11/1984 | Reichmanis et al. | 156/643 |
| 4,481,279 | 11/1984 | Naito et al. | 430/280 |
| 4,504,629 | 3/1985 | Lien et al. | 525/288 |
| 4,892,617 | 1/1990 | Bates et al. | 156/659.1 |
| 5,275,920 | 4/1994 | Sezi et al. | 430/315 |

OTHER PUBLICATIONS

K. Ito et al., Chem. Abstr. 90:138863y (1978).
Loctite Corp. Japanese Patent 62,179,506, Chem. Abstr. 108:205255g (1987).
L. Khananashvili et al., Chem. Abstr. 104:150506z (1985).
X. Guo et al., Macromolecules 23,5047 (1990).
X. Guo et al., Macromolecules 25,883 (1992).
M. Jurek, Lithographic Evaluation of Phenolic Resin-Siloxane Block Co-Polymers (1989).
M. Bowden et al., Macromol, Symp. 53, 123-137 (1992).

*Primary Examiner*—William Powell
*Attorney, Agent, or Firm*—Bell, Seltzer, Park & Gibson

[57] ABSTRACT

A resist pattern on a substrate is formed using an imageable resist layer on the surface of a substrate. The imageable resist layer comprises a silicon-incorporated polystyrene-diene block copolymer having a silicon weight percent of at least about 5 percent. The imageable layer is prepared by reacting a polystyrene-diene block copolymer with a silicon-containing compound in the presence of a platinum catalyst. In a preferred embodiment, the poly(styrene)-diene block copolymers are hydrosilylated by hydrosiloxanes using a platinum-divinyl tetramethyl disiloxane catalyst.

16 Claims, 1 Drawing Sheet

BILAYER RESIST AND PROCESS FOR PREPARING SAME

This application is a divisional of U.S. application Ser. No. 07/934,088, filed Aug. 21, 1992, now U.S. Pat. No. 5,290,397.

FIELD OF THE INVENTION

This invention relates to bilayer photoresists used in lithographic patterning and a process for preparing the same. More particularly, this invention relates to a process for preparing bilayer resists including a silicon-incorporated block copolymer layer.

BACKGROUND OF THE INVENTION

Lithographic techniques are widely practiced in the manufacture of microelectronic devices. These techniques include the use of a "resist" or a layer of a material which is deposited on a substrate, delineated into a specific pattern, and used as a mask for etching. As microelectronic devices become increasingly three-dimensional due to miniaturization, single level resists with an imageable layer are no longer sufficient for lithography because of step coverage and resolution problems. In an attempt to solve these problems, trilayer resists have been used, and are especially suitable for the lithographic definition of small features, i.e., features smaller than about 2 $\mu$m.

Typically, trilayer resists include an underlying layer deposited directly on the substrate to be processed. Because the substrate typically does not have a planar surface, this layer is deposited with a thickness sufficient to present an essentially planar surface, and accordingly is referred to as a "planarizing" layer. An intermediate protective layer, such as a silicon oxide layer, typically is then formed on the planarizing layer. This intermediate layer acts to protect a subsequently formed pattern from degradation during processing. Lastly, a third imageable layer is formed on the intermediate layer. The imageable layer is typically a photosensitive material that is delineable by exposure to radiation to create a pattern, for example by using a mask. The imageable layer is subsequently developed so that the mask pattern is transferred to the imageable layer.

Although trilayer resists provide a technique for producing fine features during semiconductor fabrication, the use of trilayer resists requires several discrete processing steps, can be cumbersome and require large capital investments. Accordingly, bilayer resists, which eliminate one layer, for example by incorporating the protective intermediate layer with the imaging layer, have been heavily investigated by researchers.

Bilayer resists are less cumbersome than trilayer resists for imaging sub-micron features on semiconductor devices which have surface topography requiring a planarizing layer. Typically bilayer resists comprise (1) a lower level that contacts the surface of the substrate and (2) an upper layer overlying the lower layer that is patterned, i.e., lithographically defined. To be effective, advantageously the lower layer is susceptible to removal by contact with oxygen reactive ion etching ("RIE") and the upper layer is essentially unaffected by RIE relative to the underlying level. Despite the enormous amount of research conducted in this area, however, very few bilayer resists have been developed that offer both desirable resolution (i.e., better than about 0.2 $\mu$m) and a suitable resistance to plasma etching (for example, a resistance to oxygen RIE of greater than 20 times greater than that of the planarizing layer, a ratio desirable for pattern reproducibility).

In bilayer resists, silicon can be incorporated into the resist polymer to provide oxygen RIE resistance. The etch rate of the polymer decreases as the weight percent of silicon increases. Incorporating silicon into polymers, however, also generally decreases the temperature at which sub-micron features are dimensionally stable, measured, for example, by the decrease in glass transition temperature ("$T_g$") of the polymer.

U.S. Pat. No. 4,061,799 to Brewer discloses the use of poly(styrene)-poly(butadiene) block copolymers as negative tone electron beam resists, i.e. a resist that cross links upon irradiation and thus becoming insoluble in many developers. The resist, however, offers insufficient oxygen RIE resistance and insufficient resolution for use in bilayer resist schemes.

U.S. Pat. No. 4,892,617 to Bates et. al. discloses the use of poly(dimethylsiloxane)-poly(chlorinatedmethylstyrene) block copolymers as negative tone electron beam resists. These resists, however, offer insufficient contrast and polymerization techniques used can result in undesirable side reactions.

M. Jurek and E. Reichmanis, Polymers in Microlithography, pp. 158-174 (1989) report the use of phenolic resin-dimethyl siloxane block copolymers. These copolymers, however, provide limited resolution and RIE protection.

M. Bowden et. al., Makromol. Chem., Macromol. Symp. 53, 125-137 (1992) disclose the use of poly(1-butene sulfone-graft poly(dimethylsiloxane) copolymers as positive tone electron beam resists. The resists, however, can suffer poor shelf life inherent in poly(1-butene sulfone) resists.

Although these processes can be used to produce resists that have good resolution, the processes can generate undesirable side reactions and/or lack sufficient protection against etching. Accordingly, there exists a need for a bilayer resist which provides desirable resolution, sufficient etching protection yet also exhibits dimensional stability.

SUMMARY OF THE INVENTION

The present invention provides a bilayer resist which prevents blurring of sub-micron images during processing and acts as a mask for underlying layers. The invention is a method for preparing silicon-incorporated polystyrene-diene block copolymers for use as imaging layers in bilayer resists. The block copolymer exhibits phase incompatibility that results in surface segregation of the silicon component. During plasma etching, the silicon component forms protective oxides which in turn provide RIE stability. In addition, the copolymer exhibits a high $T_g$, and thus the polymer has desirable dimensional stability characteristics.

The process of the invention comprises reacting a polystyrene-diene block copolymer with a silicon-containing compound in the presence of a platinum catalyst. This reaction forms a silicon-incorporated polystyrene-diene block copolymer having a silicon weight percent of at least about 5 percent. In a preferred embodiment, the poly(styrene)-diene block copolymers are hydrosilylated by hydrosiloxanes using a platinum-divinyl tetramethyl disiloxane catalyst.

In another embodiment of the invention, an imageable resist composition comprising a silicon-incorporated polystyrene-diene block copolymer as described above is provided. The invention also provides a process for forming a resist pattern on a substrate using the imageable resist composition and a microelectronic device comprising the imageable layer on the face of a substrate.

Using platinum complexes as catalysts, silicon can be efficiently incorporated into the poly(styrene)-diene block copolymers. The resultant copolymers have a high glass transition temperature, are stable to oxygen reactive ion etching, and exhibit desirable resolution properties. Accordingly, the hydrosilylated block copolymers are excellent polymers for use in bilayer resist applications.

BRIEF DESCRIPTION OF THE DRAWINGS

In the drawings which form a portion of the original disclosure of the invention:

FIG. 1A is a cross-sectional view of the semiconductor substrate having a planarizing layer on the face thereof;

FIG. 1B is a cross-sectional view of the semiconductor substrate having a layer of a silicon-incorporated block copolymer on the surface of the planarizing layer;

FIG. 1C is a cross-sectional view of the semiconductor substrate wherein the copolymer layer on the surface of the planarizing layer is patterned; and FIG. 1D is a cross-sectional view of the semiconductor substrate wherein the planarizing layer is patterned and etched.

DETAILED DESCRIPTION OF THE INVENTION

The present invention will now be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that the disclosure will be thorough and complete, and will fully convey the scope of the invention to those skilled in the art. Like numbers refer to like elements throughout. For purposes of clarity the scale has been exaggerated.

Figure 1A:
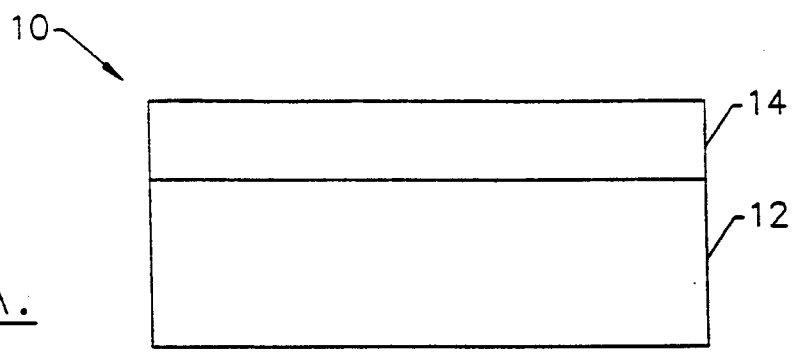
FIG. 1A-1D are side cross-sectional views of a semiconductor substrate in progressive stages of manufacture, in particular.

Referring now to FIG. 1A, a cross-sectional view of a microelectronic device comprising a semiconductor substrate having a planarizing layer on a face thereof is shown. The microelectronic device is designated generally as 10 and may be, for example, a wafer for use in VLSI circuits, ULSI circuits, and the like. In FIG. 1A, microelectronic device 10 comprises an oxidized silicon substrate 12 having a planarizing layer 14 applied to the face thereof. The composition of the planarizing layer is not critical and may be any conventional planarizing material known in the art, such as novolac, polyimide based resins and the like. Exemplary planarizing layers include, for example, polyimide commercially available from Ciba-Geigy sold under the trade name XU284 and Probimide 285, from E. I. DuPont De Nemours Company under the trade name PI2610 and the like.

Layer 14 is applied to the face of substrate 12 using any of the techniques known in the art, such as spin coating. The thickness of layer 14 depends on the size of the surface irregularities in the substrate. For example, for the manufacture of masks, typically a planarizing layer thickness is about 0.5 $\mu$m to about 3.0 $\mu$m, although thinner or thicker layers may be used.

Figure 1B:
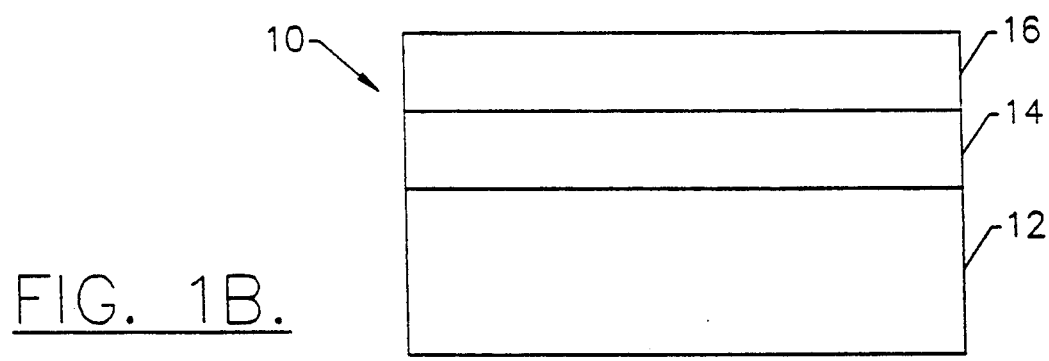

After planarizing layer 14 is formed on the face of the silicon substrate 12, an imageable layer 16 is applied to the surface of the planarizing layer 14 as illustrated in FIG. 1B. Imageable later 16 comprises a silicon-incorporated poly(styrene)-diene block copolymer, described in more detail below. Although the inventors do not wish to be bound be any explanation of the invention, it is believed that the silicon-incorporated block copolymer exhibits block microphase incompatibility so that a substantial portion of the silicon containing component segregates to the surface of the resist layer, where the silicon component is believed to form protective oxide layers during processing.

Imageable layer 16 is applied using conventional techniques for applying an imageable resist layer, such as spin coating and the like. Preferably, after imageable layer 16 is applied, the layer is subjected to a temperature sufficient to drive off solvent from the spin-on resists. The thickness of the overlying imageable layer depends on the desired resolution and oxygen RIE. Generally, the thicker the layer, the poorer the resolution. For resolution of less than about 2 $\mu$m, typically the layer thickness is about 0.1 $\mu$m to about 1.0 $\mu$m.

After its application to the surface of planarizing layer 14, imageable layer 16 is delineated by exposure to radiation such as electrons, X-rays, or ion beams, to induce a change in the exposed portions of the material. Exposure using radiation through a mask with clear and opaque features that define the pattern to be created may also be used.

Figure 1C:
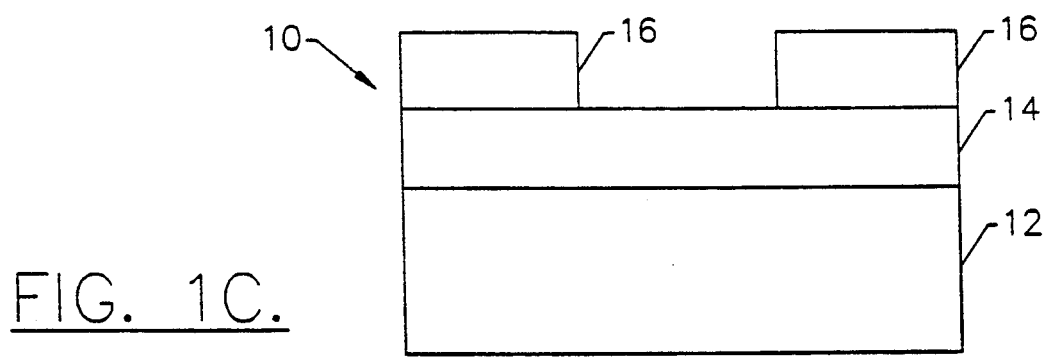

The delineated material is then developed by subjecting the material to an environment that removes the unexposed portion of the negative acting material. Removal media include liquid solvents. The resultant patterned copolymer layer is illustrated in FIG. 1C.

Figure 1D:
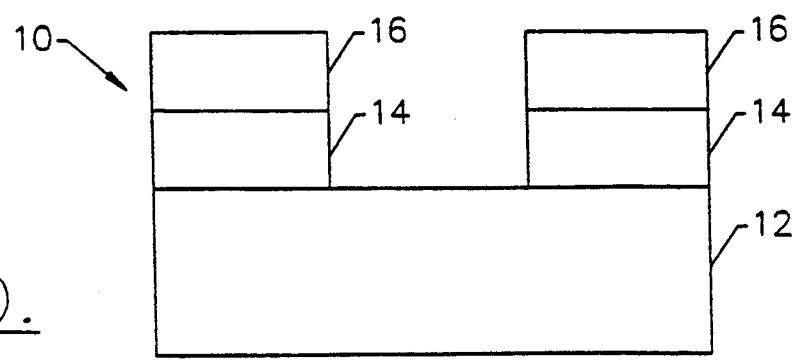

After the resist material is delineated and developed, the pattern is transferred to the planarizing layer using conventional techniques known in the art to provide the structure of FIG. 1D. Pattern transfer is typically accomplished by subjecting the substrate to an oxygen plasma. Such techniques are well known in the art and are described in Introduction to Microlithography, Chap. 6, edited by L. F. Thompson et. al., American Chemical Society, Symposium Series 219, Washington, D.C. 1983, the disclosure of which is incorporated herein in its entirety. Preferably, oxygen reactive ion etching is used.

After the pattern is transferred to the underlying layer, the delineated resist can be used as a mask to further process the silicon substrate through steps such as metallization, dopant, diffusion, and/or etching. Subsequently, the delineated resist is removed by procedures such as etching and/or plasma stripping. In a preferred embodiment of the invention, the silicon-incorporated block copolymer is used as a component in bilayer resist, although it will be apparent to the skilled artisan that the copolymer of the invention may also be used as a single layer resist.

As is known in the art, block copolymers are copolymers comprising two or more different blocks of monomer units alternating with each other, wherein the different blocks are covalently linked together. Each block is distinct, being composed of different monomers from the blocks to which it is attached. Also known in the art, the term "diene" refers to an aliphatic compound (i.e., olefin) containing two conjugated double bonds. For example, styrene-butadiene block copolymers are blocks of styrene polymer joined to blocks of butadiene polymers.

The block copolymers of the present invention include diblock and tri-block copolymers based on polystyrene (S) and polydiene rubber blocks. The rubber block can consist of butadiene (B) or isoprene (I). Thus, S-B, S-I, as well as S-B-S and S-I-S block copolymers can be used. Preferably, the block copolymer is S-I.

Suitable block copolymers may be synthesized using well known anionic polymerization techniques. Also, suitable block copolymers are commercially available, for example, S-B diblocks available from Shell Development Company under the KRATON trade name and from Phillips Petroleum Co. under the SOLPRENE trade name. Advantageously the block copolymer is selected so that the diene blocks have some portion of its diene monomer in the 1,2 or 3,4 configuration. Preferably the block copolymer used in accordance with the invention comprises about 15 to 85% by weight styrene. The molecular weight $M_n$ of each of the copolymer blocks is from about 500 to 10,000,000.

As will be appreciated by those skilled in the art, the styrene and rubber blocks of the copolymer exhibit phase incompatibility and accordingly the blocks separate or segregate to form two phases. In accordance with the process of the present invention, the block copolymer as described above is reacted with a silicon-containing compound to thereby incorporate silicon into the block copolymer chain, specifically into the rubber block. It is believed that because the block copolymer exhibits phase incompatibility between the styrene and rubber blocks, the silicon-containing rubber blocks separate and exhibit surface segregation due to surface energies. Thus the silicon-containing block copolymer of the invention exhibits phase separation and surface segregation of the silicon component.

On the surface, the silicon component forms protective oxides or oxide layers during processing, i.e., plasma etching, which in turn protect the polymeric component. The block copolymer is reacted with the silicon containing compound in an amount sufficient to form a silicon-incorporated polystyrenediene block copolymer that upon exposure to gas plasma forms the protective silicon oxides. Advantageously, the silicon is incorporated in the block copolymer in a weight percentage of at least about 5%.

Also as will be appreciated by those skilled in the art, styrene polymers exhibit a relatively high glass transition temperature ($T_g$) of about 100° C. The use of a polymer having a relatively high $T_g$ is desirable to provide sufficient dimensional stability to the resist layer. This in turn provides good resolution of submicron images during processing, thus further enabling pattern transfer. Because the block copolymer exhibits phase incompatibility as described above, the $T_g$ of the styrene phase is relatively unaffected by the amount of silicon incorporated into the block copolymer. Therefore, a sufficient amount of silicon can be incorporated into the block copolymer to achieve the desired etching protection of the mask pattern without significantly affecting resolution capabilities.

The block copolymers of the invention are capable of imaging sub-micron features, have a sensitivity of less than about 50 $\mu C/cm^2$, and preferably less than about 35 $\mu C/cm^2$, and an etch rate of at least about 20 times slower than that exhibited by conventional hard baked polyimide. In contrast, standard electron beam resists, for example those formed using methyl methacrylate polymers, can exhibit a sensitivity of about 100 $\mu C/cm^2$.

The silicon component is incorporated into the block copolymer using a hydrosilylation reaction. As will be appreciated by those skilled in the art, hydrosilylation processes involve the addition reaction of a organosilicon compound with at least one Si-H group, such as hydrosilanes, hydrosiloxanes, and the like, to a reagent, here alkenes, to give an organic silicon derivative. Hydrosilylation processes are generally described by T. Hiyama and T. Kusumoto in Comprehensive Organic Synthesis, B. M. Trost, ed., Pergamon Press, Vol. 8, p. 764 (1991), and by J. L. Speir, Adv. Organomet. Chem. 17, 407 (1979), the disclosure of each is incorporated herein in its entirety.

Hydrosilanes may be generally described as a silicon and hydrogen compound typically having the formula $Si_nH_{2n+2}$, and are analogous to alkanes or saturated hydrocarbons. Hydrosiloxanes may be generally described as straight chain compounds analogous to hydrocarbons comprising a silicon atom bonded to four oxygen atoms. Hydrosiloxanes also include compounds wherein hydrogen replaces two or more of the oxygen atoms such as disiloxanes and trisiloxanes. As will be appreciated by the skilled artisan, one or more of the hydrogen atoms of the hydrosilane groups and one or more of the oxygen atoms of the hydrosiloxane group may be substituted by hydrogen (in the case of a hydrosiloxane); an alkyl group such as methyl, ethyl, and propyl; alkoxy groups such as methoxy and ethoxy; halogen; siloxyl; alkylsiloxy such as dimethylsiloxy and trimethylsiloxy; and the like. The silicon source used in accordance with the present invention may be any of the silicon-containing compounds as described above. Preferably the silicon-containing compound is a hydrosiloxane, and more preferably is a hydrosiloxane selected from the group consisting of pentamethyldisiloxane, 1,1,1,3,5,5,5-heptamethyltrisiloxane, and 1,1,1,3,3,5,5-heptamethyltrisiloxane. These compounds are commercially available, for example, from Hüls America, Inc.

The hydrosilylation reaction may be catalyzed by one of a number of known catalysts, such as peroxides and transition metal complexes. Transition metal complexes, and particularly platinum complexes are preferred. The platinum catalyst may be, for example, hexachloroplatinum (IV) acid ($H_2PtCl_6$); platinum olefin complexes such as those described in U.S. Pat. Nos. 3,159,601 and 3,159,662; the reaction product of platinum compounds with alcohols, aldehydes and ethers as described in U.S. Pat. No. 3,220,972; and platinum-vinylsiloxane complexes, such as those described in U.S. Pat. No. 4,421,903, the disclosure of each which is incorporated herein in its entirety. Preferably the platinum catalyst is a platinum-vinylsiloxane complex, such as those described in U.S. Pat. No. 4,421,903.

Platinum-vinylsiloxane complexes used in accordance with the present invention comprise platinum and an organosiloxane of the formula:

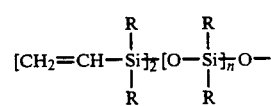

wherein R is free of aliphatic unsaturation and is selected from alkyl radicals, cycloalkylradicals and phenyl radicals and n is 0 or an integer from 1 to 1000. The platinum and organosiloxane are chemically combined by heating in the substantial absence of an acid binding agent (i) a platinum halide with (ii) an amount of the organosiloxane sufficient to provide not less than about 0.01 gram atom of platinum per mole of vinyl content in the organosiloxane compound, and an amount of platinum in the catalyst of not substantially less than about 2.0% by weight.

The amount of catalyst used is a function of the catalyst composition and type. Typically, the catalyst content is about 5 to 1000 ppm, and preferably about 10 to 100 ppm. An especially preferred catalyst in the present invention is platinum divinyltetramethyl-disiloxane.

The following examples are provided to further illustrate the present invention. These examples are illustrative of the invention and should not be construed as limiting thereof.

EXAMPLE 1

Purification of Materials

A block copolymer available from Shell Development Company was obtained comprising a styrene-butadiene block copolymer mixture of poly(styrene-b-butadiene) and poly(styrene-b-butadiene-b-styrene). The true molecular weight $M_n$ of the styrene blocks was 12,500. The true $M_n$ of the butadiene blocks were 64,000 and 128,000 for the diblock and triblock copolymers respectively. From gel permeation chromatography ("GPC") the diblock copolymer had a $M_n$ of 110,000 and a polydispersity of 1.07, while the triblock had a $M_n$ of 350,000 and a polydispersity of 1.13. The composition of the butadiene blocks was 40% 1,2-butadiene and 60% 1,4-butadiene.

12.05 grams of the block copolymer was dissolved in 200 mL of toluene and precipitated into 1500 mL of ethanol. The block copolymer was then dried in vacuo to constant weight.

EXAMPLE 2

Preparation of Polymers

A. Additional of Pentamethyldisiloxane (PMDS) to Shell Copolymer:

1.02 g of the Shell copolymer (6.20 mmol vinyl group) was dissolved in 50 mL of anhydrous toluene in a 100 mL three neck round bottom flask equipped with a septum and condenser under nitrogen. The solution was heated to 80°-85° C. After 1 hour, 13.7 μL ($4.6 \times 10^{-4}$ mmol Pt) of platinum divinyltetramethyl-disiloxane ("Pt-DTD") was added to the solution. After an additional 30 minutes, 1.16 mL (5.90 mmol) PMDS was added. The reaction was determined to be completed in 18 hours, using gas chromatography. The colorless solution was then cooled, filtered, and concentrated to about 25 mL, followed by precipitation into 250 mL of anhydrous ethanol. The polymer was redissolved in toluene, reprecipitated in ethanol and then dried in vacuo for 24 hours (1.65 g, 86.5% yield; $T_g = -63.20$ C.). The conversion of the 1,2-butadiene units was determined by $^1$H NMR to be 87%. GPC of Biblock: Mn 135,000, P 1.07. GPC of Triblock: Mn 543,000, P 1.34.

B. Addition of 1,1,1,3,3,5,5-Heptamethyltrisiloxane (HMTS) to Shell Copolymer:

0.50 g of the Shell copolymer (3.10 mmol vinyl group) was dissolved in 30 mL of anhydrous toluene in a 50 mL three neck round bottom flask equipped with a septum, a condenser, and a dropping funnel under nitrogen. The dropping funnel contained 0.85 mL HMTS (3.1 mmol) and 10 mL toluene. The solution in the round bottom flask was heated to 90°-95° C. After 1 hour, 6.0 μL ($2.0 \times 10^{-4}$ mmol Pt) to Pt-DTD was added to the reaction vessel. After 30 minutes, the HMTS solution was added dropwise to the round bottom flask. The reaction was determined to be completed in 24 hours, using FTIR. The yellow tinged solution was then cooled and precipitate into 250 mL anhydrous ethanol. The polymer was redissolved in toluene, reprecipitated in ethanol and dried in vacuo for 24 hours (1.1 g, 91.6% yield; $T_g = -73°$ C.). The conversion of the 1,2-butadiene units was determined by $^1$H NMR to be 92%. GPC of Biblock: Mn 132,000, P 1.19. GPC of Triblock: Mn 553,000, P 1.27.

C. Addition of 1,1,1,3,3,5,5-Heptamethyltrisiloxane (HMTS) to Shell Copolymer at Reflux:

1.0 g of the Shell copolymer (6.20 mmol vinyl group) was dissolved in 250 mL of anhydrous toluene in a 500 mL three neck round bottom flask equipped with a septum and condenser, under nitrogen. The solution was heated to reflux. After 1 hour, 9.0 μL ($3.0 \times 10^{-4}$ mmol Pt) of Pt-DTD and 6.38 g (28.7 mmol) of HMTS was added to the reaction vessel. After 18 hours the yellow tinged solution was concentrated, cooled and precipitate into 150 mL anhydrous ethanol. The polymer was redissolved in toluene, reprecipitated in ethanol and dried in vacuo for 24 hours ($T_g = -73°$ C.). The conversion of the 1,2-butadiene units was determined by $^1$H NMR to be 92%.

D. Addition of Bis(trimethylsiloxy)methylsilane (BTs) to shell Copolymer:

0.50 g of the Shell copolymer (3.10 mmol vinyl group) was dissolved in 70 mL of anhydrous toluene in a 100 mL three neck round bottom flask equipped with a septum, condenser and dropping funnel under nitrogen. The dropping funnel contained 1.34 mL BTS (5.0 mmol) and 15 mL toluene. The solution, in the round bottom flask, was heated to 85°-90° C. followed by the addition of 15 μL ($5.1 \times 10^{-4}$ mmol Pt) Pt-DTD. After 30 minutes, the BTS solution was added drop wise to the round bottom flask. The reaction was determined to be completed in 48 hours, using FTIR. The yellow tinged solution was then cooled and precipitated into 350 mL anhydrous ethanol. The polymer was redissolved in toluene, reprecipitated in ethanol and dried in vacuo for 24 hours (1.05 g, 88% yield). The conversion of the 1,2-butadiene units was determined by $^1$H NMR to be 91%. GPC of Diblock: Mn 123,000, P 1.08. GPC of Triblock: Mn 497,000, P 1.64.

E. Addition of Bis(trimethylsiloxy)methylsilane (BTS) to shell Copolymer at reflux:

1.0 g of the Shell copolymer (6.20 mmol vinyl group) was dissolved in 250 mL of anhydrous toluene in a 500 mL three neck round bottom flask equipped with a septum and condenser under nitrogen. The solution was heated to reflux followed by the addition of 14 μL (4.8 $\times 10^{-4}$ mmol Pt) Pt-DTD and 8.46 mL (31.6 mmol of BTS. After 18 hours the yellow tinged solution was then cooled and precipitated into 100 mL anhydrous ethanol. The polymer was redissolved in toluene, reprecipitated in ethanol and dried in vacuo for 12 hours (1.77 g, 74% yield). The conversion of the 1,2-butadiene units was determined by $^1$H NMR to be 91%. GPC of Diblock: Mn 76700, P 1.1. GPC of Diblock: Mn 135,000, P 1.07. GPC of Triblock: Mn 302000, P 1.9.

F. Addition of Pentamethyldisiloxane (PMDs) to Poly(styrene)-b-Poly(isoprene):

2.0 g of poly(styrene)-b-Poly(isoprene) (The true $M_n$ of each block was 13000. By GPC the $M_n$ of the block copolymer was 25800 and P 1.46. The composition of the isoprene block was 25% 1,2-isoprene and 75% 3,4-isoprene, 14.8 mmol vinyl group) was dissolved in 90 mL of anhydrous toluene in a 150 mL three neck round bottom flask equipped with a septum and condenser under nitrogen. The solution was heated to 80°–85° C. After 20 minutes, 20 $\mu$L (6.8×10 mmol Pt) of Pt-DTD was added to the solution. After an additional 30 minutes, 1.97 mL (10.0 mmol) PMDS was added. The reaction was determined to be not proceeding after 24 hours, using GC and FTIR. The light yellow solution was then cooled and filtered, followed by precipitation into 350 mL of anhydrous ethanol. The polymer was redissolved in toluene, reprecipitated in ethanol and then dried in vacuo for 24 hours (2.52 g, 87.1% yield). The conversion of the 1,2-and 3,4-isoprene units was determined by $^1$H NMR to be 60% and 28% respectively. GPC: $M_n$ 29,500, P 1.47.

G. Addition of Heptamethyltrisiloxane (HMTS) to Poly(isoprene):

0.88 g of poly(isoprene) ($M_n$=25,000; by GPC the $M_n$ of the block copolymer was 38,500 and P=1.07. The composition of the isoprene block was 28.9% 1,2-isoprene, 68.1% 3,4-isoprene and 3.0% 1,4-isoprene, 13.0 mmol vinyl and methyl vinyl group) was dissolved in 45 mL of anhydrous toluene in a 100 mL three neck round bottom flask equipped with a septum and condenser under nitrogen. The solution was heated to 80°–85° C. After 1 hour, 10 $\mu$L (3.4×10$^{-4}$ mmol Pt) of Pt-DTD was added to the solution. After an additional 20 minutes, 2.74 mL (10 mmol) HMTS was added. The reaction was determined to be completed in 24 hours, using FTIR. The light solution was then cooled, filtered, and concentrated to about 15 mL, followed by precipitation into 200 mL of anhydrous methanol. The polymer was redissolved in toluene, reprecipitated in methanol and then dried in vacuo for 24 hours (1.50 g, 92% yield). The conversion of the 1,2-and 3,4-isoprene units was determined $^1$H NMR to be 64% and 8.7% respectively. GPC: $M_n$ 53,200, P=1. 16.

EXAMPLE 3

Oxygen RIE Resistance of Hydrosilylated Poly(styrene)-Poly(diene) Block Copolymers A. Heptamethyltrisiloxane modified Shell copolymer:

1.31 g of the polymer described in example 2A was dissolved in 36 mL of toluene. The solution was then filtered through 0.1 $\mu$m teflon filters. Films of the polymer described in example 2A were then spun onto 3 inch silicon wafers at 3000 RPM for 30 seconds resulting in a 0.1 $\mu$m thick film. CIBA-GEIGY poly(imide) XU284 was spun onto 3 inch silicon wafers at 2700 RPM for 30 seconds resulting in a 2.4 $\mu$m thick film. The poly(imide) coated wafer was then heated in air at 85° C. for 30 minutes, then 150° C. for 15 minutes followed by 240° C. for 15 minutes. The two samples were placed in a Applied Materials Reactive Ion Etcher which was then operated at an O$_2$ flow rate of 30 sccm, a pressure of 30 motor and a power of 0.25 W/cm$^2$. The samples were removed after 10 minutes. The thickness of both samples after etching were measured and a etch selectivity ratio of the material in example 2A relative to poly(imide) of 54 calculated.

B. Pentamethyldisiloxane modified Poly(styrene)-b-Poly(isoprene) copolymer:

0.2026 g of the polymer described in example 2F was dissolved in 5.6 mL of toluene. The solution was then filtered through 0.1 $\mu$m teflon filters. Films of the polymer described in example 2F were then spun onto 3 inch silicon wafers at 3000 RPM for 30 seconds resulting in a 0.17 $\mu$m thick film. Poly(imide) films were spun and heated as described in example 3A. The two samples were placed in a Applied Materials Reactive Ion Etcher which was then operated at a O$_2$ flow rate of sccm, a pressure of 30 motor and a power of 0.25 W/cm$^2$. The samples were removed after 10 minutes. The thickness of both samples after etching were measured and a etch selectivity ratio of the material in example 2F relative to poly(imide) of 44 calculated.

EXAMPLE 4

E-beam Exposure and Development of Pentamethyldisiloxane Modified Poly(styrene)-b-Poly(isoprene) Copolymer The solution described in example 3B was used to spin a film of the polymer described in example 2F onto 3 inch silicon wafers at 3000 RPM for 30 seconds resulting in a 0.17 $\mu$m thick film. The coated substrate was exposed using a JEOL electron beam exposure system operating 50 kV and 1 nA. The exposure consisted of lines of 0.2 $\mu$m, 0.1 $\mu$m and single scan lines with spacing ranging from 1.6 $\mu$m to 1.8 $\mu$m. The exposure dose for each series of lines ranged from 20 $\mu$C/cm$_2$ to 200 $\mu$C/cm$_2$. The exposed substrates were developed using a mixture of toluene and acetone (99:1) and then rinsed in isopropanol. A resolution better than 0.1 $\mu$m, a contrast of 2.8 and a sensitivity of 50 $\mu$C/cm$_2$ was observed.

EXAMPLE 5

Use of Pentamethyldisiloxane Modified Poly(styrene)-Poly(isoprene) Block Copolymer in Bilayer Resist Schemes CIBA-GEIGY poly(imide) XU284 was spun onto 3 inch silicon wafers at 6500 RPM for 30 seconds resulting in a 1.2 $\mu$m thick film. The poly(imide) film was heated using the procedure described in example 3A. On top of the poly(imide) a film of the polymer described in example 2F was spun using the solution and spinning technique described in example 4. The coated substrate was exposed using a JEOL electron beam exposure system operating 50 kV and 1 nA. The exposure consisted of lines of 0.5 $\mu$m, 0.3 $\mu$m and single scan lines with spacing ranging from 1.3 $\mu$m to 1.8 $\mu$m. The exposure dose for each series of lines ranged from 20 $\mu$C/cm$_2$ to 160 $\mu$C/cm$_2$. The exposed substrates were developed using a mixture of toluene and acetone (99:1) and then rinsed in isopropanol. The resolution better than 0.1 $\mu$m, a contrast of 2.8 and a sensitivity of 30 $\mu$C/cm$_2$ measured. The pattern was transferred through the poly(imide) using the etch process described in Example 3.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A microelectronic device comprising:
   a semiconductor substrate having a face;
   an imageable layer on said face, the imageable layer comprising a silicon-incorporated polystyrene-diene block copolymer having silicon present in the block copolymer in an amount sufficient to form silicon oxides in the presence of a gas plasma in an amount sufficient to resist etching of the block copolymer upon exposure to the gas plasma.

2. The device according to claim 1 wherein the silicon weight percent of the silicon-incorporated block copolymer is a least about 5 percent.

3. The device according to claim 1 further comprising an intermediate planarizing layer between said imageable resist layer and said substrate face.

4. The device according to claim 1 wherein said polystyrene-diene block copolymer is selected from the group consisting of polystyrene-butadiene and polystyrene-isoprene block copolymers.

5. A microelectronic device comprising:
   a semiconductor substrate having a face;
   a planarizing layer on said face; and
   an imageable layer comprising a silicon-incorporated polystyrene-diene block copolymer having a silicon weight percent of at least about 5 percent.

6. A process for preparing a silicon-incorporated polymer which is particularly useful as an imageable layer in microelectronic device fabrication, the process comprising:
   reacting a polystyrene-diene block copolymer with a silicon-containing compound in the presence of a platinum catalyst,
   wherein the amount of silicon used is sufficient to form a silicon-incorporated polystyrene-diene block copolymer that upon exposure to gas plasma forms silicon oxides in an amount sufficient to resist etching of the block copolymer in the gas plasma.

7. The process according to claim 6 wherein the amount of silicon used is an amount that will provide a silicon weight percent of at least 5 percent in the resulting silicon-incorporated block copolymer.

8. The process according to claim 6 wherein the reacting step comprises reacting a polystyrene-diene block copolymer selected from the group consisting of polystyrene-butadiene and polystyrene-isoprene block copolymers with a silicon-containing compound.

9. The process according to claim 6 wherein the reacting step comprises reacting a polystyrene-diene block copolymer with a hydrosiloxane compound.

10. The process according to claim 9 wherein the reacting step comprises reacting a polystyrene-diene block copolymer with a hydrosiloxane compound selected from the group consisting of pentamethyldisiloxane, 1,1,1,3,5,5,5-heptamethyltrisiloxane, and 1,1,1,3,3,5,5-heptamethyltrisiloxane.

11. The process according to claim 6 wherein the reacting step comprises hydrosilylating the block copolymer with the silicon-containing compound.

12. The process according to claim 6 wherein the platinum catalyst is a platinum divinyl tetramethyl disiloxane complex.

13. An imageable resist composition comprising a silicon-incorporated polystyrene-diene block copolymer having silicon present in the block copolymer in an amount sufficient to form silicon oxides in the presence of a gas plasma in an amount sufficient to resist etching of the block copolymer upon exposure to the gas plasma.

14. The composition according to claim 13 wherein the silicon weight of the silicon-incorporated block copolymer is at least about five percent.

15. The composition according to claim 13 wherein said silicon-incorporated polystyrene-diene block copolymer is a hydrosilylation reaction product.

16. The composition according to claim 13 wherein said polystyrene-diene block copolymer is selected from the group consisting of polystyrene-butadiene and polystyrene-isoprene block copolymers.

* * * * *